United States Patent [19]

Hutchings et al.

[11] 4,383,763
[45] May 17, 1983

[54] CONTROLLABLE MIRRORS

[75] Inventors: Thomas J. Hutchings; David C. Grant, Jr., both of Thousand Oaks; Gary D. Babcock, Mission Viejo, all of Calif.

[73] Assignee: Litton Systems, Inc., Beverly Hills, Calif.

[21] Appl. No.: 261,851

[22] Filed: May 8, 1981

Related U.S. Application Data

[63] Continuation of Ser. No. 74,619, Sep. 12, 1979, abandoned.

[51] Int. Cl.³ .............................................. G01B 9/02
[52] U.S. Cl. ...................................... 356/350; 310/332
[58] Field of Search ............................. 310/328–332; 350/487; 356/350; 372/94, 99

[56] References Cited

U.S. PATENT DOCUMENTS

| | | | |
|---|---|---|---|
| 1,919,480 | 7/1933 | Rieber | 310/329 |
| 3,581,227 | 5/1971 | Podgorski | 350/350 X |
| 4,067,241 | 1/1978 | Corbett | 310/331 X |
| 4,113,387 | 9/1978 | Shutt | 331/94.5 S X |
| 4,160,184 | 7/1979 | Ljung | 310/369 X |

FOREIGN PATENT DOCUMENTS 2749157  5/1958  Fed. Rep. of Germany ...... 356/350

OTHER PUBLICATIONS

"Technology Study on Piezoelectric Materials", Final Report Period Jul. 78–Dec. 78; Defense Nuclear Agency #4859F Dtd. Jul. 20, 1979.

Primary Examiner—F. L. Evans
Attorney, Agent, or Firm—Roy L. Brown

[57] ABSTRACT

A mirror constrained to translation and whose position is controlled by a piezoelectric ceramic operating as a bimorph.

15 Claims, 2 Drawing Figures

CONTROLLABLE MIRRORS

This is a continuation application of U.S. patent application Ser. No. 74,619, filed Sept. 12, 1979, now abandoned.

BACKGROUND OF THE INVENTION

The closest known prior art is that found in U.S. Pat. No. 3,581,227 which issued May 25, 1971 to Theodore J. Podgorski for an "Adjustable, Thin Membrane Mirror For Use In The Stabilization Of Ring Lasers." The patent shows a triangular ring laser path with mirrors at each of the corners of the triangle. One of the corners has a mirror whose in-out position is controlled in response to an electrical signal. The position may be controlled, typically, to tune the laser or to minimize lock-in between two laser frequencies.

The structure shown and claimed uses a block of the same dimensionally stable material as that used for the laser housing. The block is circularly grooved on its internal side to leave a depressed thin integral gas-impervious annular web surrounding a light-reflecting surface. The light-reflecting surface is positioned internally in the web on a circularly cylindrical central post which was left inwardly-standing from an integral with the membrane for that purpose. Radially outward from the groove is a rigid annular member which is integral with the membrane but which extends axially external to the region enclosed by the membrane. Within an opening formed by the rigid annular member but external to the membrane is a stack of piezoelectric ceramic wafers which bear against the external side of the membrane and of the inwardly-standing post. The opening containing the ceramic wafer stack is closed with a rigid disc-like member which is rigidly attached to the annular member to support the stack of ceramic wafers.

When an electrical signal is applied to the wafer stack, the stack produces a force between the supporting rigid disc-like member and the external end of the inwardly-standing post and mirror. The force from the ceramic stack is principally axial, but it also may have a twisting force which tilts the inwardly-extending post and mirror. Such tilting reduces the utility of the mirror.

BRIEF DESCRIPTION OF THE INVENTION

The apparatus of this invention is also designed to be used in a ring laser, and its purpose is to be used for the same functions as that described above for the apparatus of U.S. Pat. No. 3,581,227.

The apparatus of this invention, however, eliminates tilting of the mirror by using a novel spaced-membrane structure which is driven by two ceramic crystal wafers operating as a bymorph.

The apparatus of this invention uses a block of the same dimensionally stable material as that used for the laser housing. The block is typically, but not necessarily, circular cylindrical. The shown block is circularly cylindrical with a substantially flat internal surface. In the center of that surface is a mirror coating which may alternatively be flat or preferably slightly curved.

The external side of the block has an annular recess extending almost the full length of the block to form a thin annular membrane extending radially from the mirror to a rigid outer rim and to form a central post outwardly-standing from the region of the mirror along the axis of the block. The membrane, outer rim and central post are preferably formed in one integral place. A thin disc is fastened to the external ends of the rim and central post to form a second membrane extending radially from the central post to the rim. The two spaced-apart membranes constrain the central post and its attached mirror to allow only axial motion of the post and mirror.

To drive the central post and attached mirror axially relative to the rim, a fixture is attached to the rim. In a preferred embodiment, the fixture is temperature insensitive. Such insensitivity may be achieved by constructing it of temperature insensitive metal such as Invar.

A typical drive fixture is attached to the outer periphery of the circular rim of the block. It may, for example, be clamped or glued onto the block. The fixture extends axially outwardly from the block in a rigid rim to support a flexible annular metallic membrane which supports a rigid axial hub. Inwardly directed from the hub is an adjustable bearing screw which bears against the central portion of the outer disc attached to the block. A bearing plate may be attached to the outer disc to receive the thrust of the bearing screw.

A pair of thin piezoelectric annular ceramic wafers are attached to the two surfaces of the metallic membrane. The ceramic wafers preferably have a thin metallic film on the outer surface thereof to receive an electric potential. The two metallic films are at the same electrical potential, and the control voltage is connected between the films and the metallic membrane to cause the two ceramic wafers to operate as a bimorph. The applying of such a control voltage with oppositely directed potential gradients on the two ceramic wafers cause the wafers to be radially strained in opposite directions, thereby bending the metallic membrane so that axial forces are delivered to the hub of the membrane thence through the bearing screw and central post to the mirror to displace the mirror in pure axial motion without tilting.

Thus, it is an object of this invention to control the displacement of a mirror.

It is a more particular object of this invention to control the microdisplacement of a mirror in a ring laser in a pure inward and outward direction relative to the laser path.

BRIEF DESCRIPTION OF THE DRAWINGS

Other objects will become apparent from the following description taken in conjunction with the accompanying drawings, in which.

DETAILED DESCRIPTION OF THE INVENTION

Figure 1:
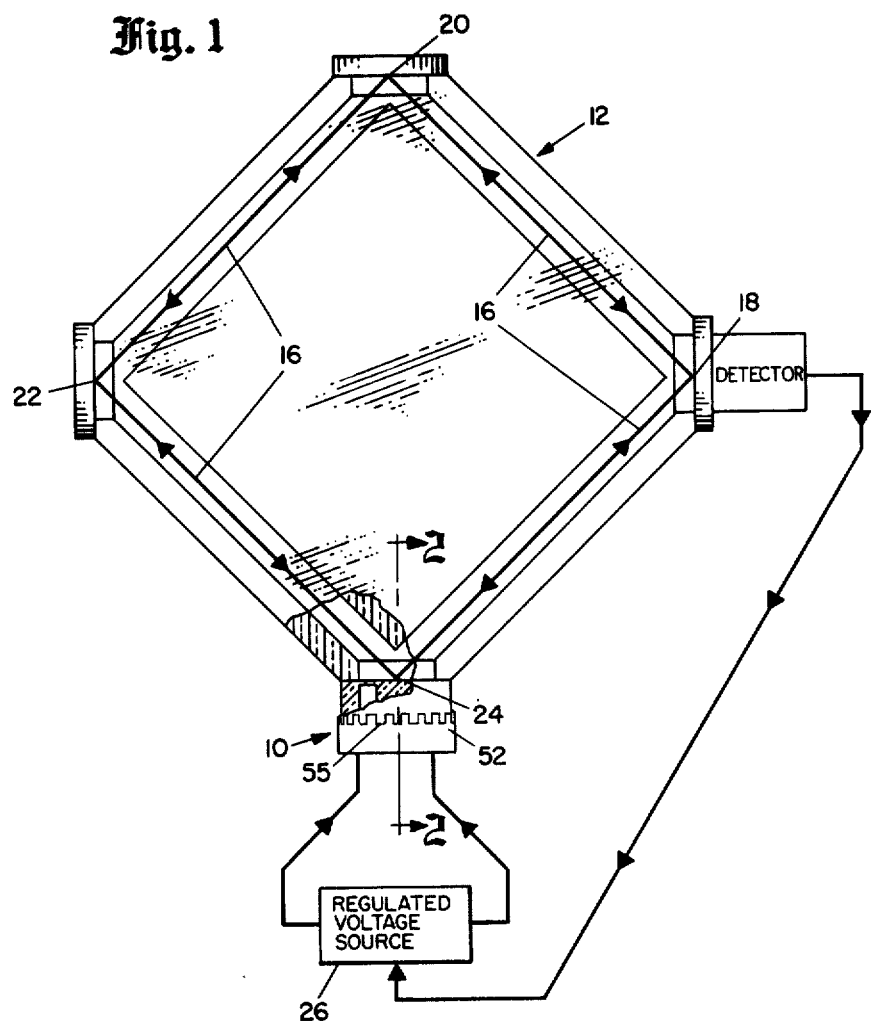
FIG. 1 is a plan view of a typical ring laser, showing the positioning of the apparatus of this invention.
Figure 2:
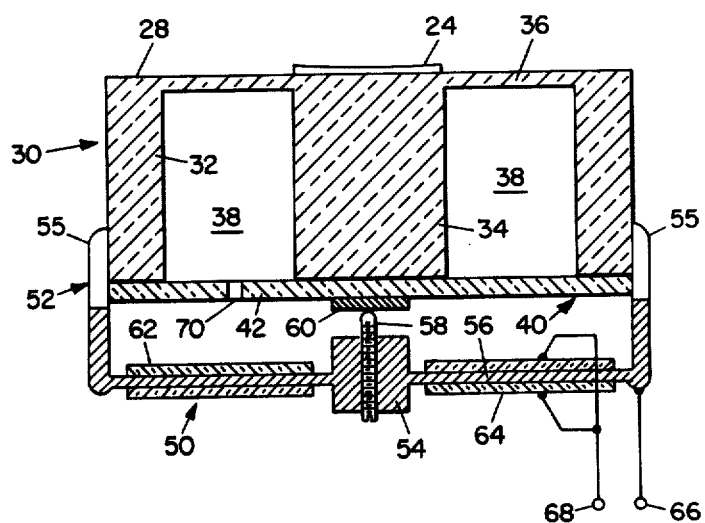
FIG. 2 is a view, partly in section, taken at 2—2 in FIG. 1.

The apparatus of this invention, shown generally at 10 in FIG. 1, is structure to be used in a ring laser 12.

Typically, a ring laser 12 is fabricated of a dimensionally stable material such as quartz, glass or ceramic. Within the laser body 14 are regions containing gas. A typical gas is a neon-helium mixture. The gas regions are positioned so that a closed path shown by arrows 16 can become excited in the gas region. The shown closed path of the arrows 16 is formed as a square, although it may be any closed path, and the closed path need not be planar. Lasing is excited, for example, by channeling ion and electron flow (by means not shown) into the laser gas.

At the corners of the closed path are mirrors 18, 20, 22, and 24 which reflect the laser light into the closed path. The mirrors 18–24 are typically optically flat, but they may be slightly curved with a long radius of curvature to allow for slight misalignment. One of the mirrors 18 may be only part reflective, and it allows light from both directions of travel of the laser light to be transmitted to light sensing members (not shown) which convert the light into electrical signals that may be connected to a controlled voltage source 26.

The controlled voltage source may deliver voltage to the apparatus of this invention to control the position of the mirror 24. For example, the mirror 24 may be moved in and out toward and away from the laser path, thereby to affect the light delivered to the mirror 18. Thus, a closed loop servo between the sensors (not shown) associated with the mirror 18 and the position of the mirror 24 is formed.

Alternatively, other electronics (not shown) may be used to drive the mirror to a preferred position.

The mirror 24 sits on the interior surface 28 of the block 30. The block 30 is preferably made of the same dimensionally-stable material as the laser body 12. The block 30 is sealed to the body 12 in a gas-tight seal. Such sealing may be by an adhesive or, preferably, by diffusion bonding.

In a preferred embodiment, the block 30 is circularly cylindrical with an outer rim 32, a central post 34 along the axis and a membrane 36 integral with and connecting the rim 32 and the central post 34. An annular opening 38 is formed on the axially exterior side of the block 30, and the opening 38 extends almost the full length of the block 30 to form the thin membrane 36. The inner and outer walls of the opening 38 are defined by the post 34 and the rim 32.

Across the axially exterior end of the block 30 is positioned a disc 40 which is attached to the rim 32 and the central post 34 to form a membrane 42 bridging the open end of the annular opening 38. The attachment of the disc 40 may be, for example, by adhesives (not shown) or, preferably, by diffusion bonding. The pair of axially spaced-apart substantially parallel flexible membranes 36 and 42 attached between the rigid members 32 and 34 constrain the central post 34 to allow only axial translation of the post 34 and mirror 24 relative to the rim 32, and no tilting of the mirror 24 is allowed.

The inward and outward movement of the central post 34 and mirror 24 relative to the rim 32 is forced by a fixture 50. The fixture 50 clamps to the rim 32. In the shown preferred embodiment the fixture 50 is made of Invar and is dimensionally stable. The fixture 50 has a rim 52 which, preferably, is axially slotted to form flexible axially-directed attachments 55 to the outer periphery of the block 30 and the disc 40 without stressing block 30 or disc 40. The fixture 50 has a hub 54 positioned on the axis and a metallic annular membrane 56 bridging radially between the rim 52 and the hub 54. The membrane 56 is axially offset away from the disc 40 so that a bearing screw 58 may be screwed into the hub 54 and bear against the bearing plate 60 which is attached to the center of the disc 40. The screw is adjustable so that it may be firmly positioned against the bearing plate 60 for initial positioning of the mirror.

Two annular piezoelectric ceramic wafers 62, 64 are positioned on and attached to opposite faces of the membrane 56. Conductive films (not shown) may be deposited on the faces of the ceramic wafers 62, 64. The control voltage is connected from one terminal 66 to the metallic membrane 56. The other voltage terminal 68 is connected to the axially-outward surface of the wafer 64 and to the axially-inward surface of the wafer 62.

In operation, a control voltage is applied between the terminals 66 and 68 which causes one of the wafers 62 or 64 to lengthen and the other wafer to shorten along their radial dimensions. The shortening of one wafer and the lengthening of the other warps the membrane 64 and forces the hub 54 either toward or away from the block 30. The force on the hub 54 is transmitted through the bearing screw 58 and bearing plate 60 to the center of the disc 40, thence axially through the post 34 to the mirror 24, moving the mirror 24 either inwardly toward the interior of the laser or outwardly toward the exterior of the laser. To avoid producing a force due to differential expansion of the wafers 62, 64, the wafers preferably are matched to have substantially identical thermal expansion coefficients.

The air holes 70 allow escape of gas during assembly and heating of the chamber 38.

Although the membranes have been described as annular, it is informative to point out that they may have other shapes while still maintaining the desired protection against mirror tilt.

In the described embodiment, the exterior of the central post was described as circular, and the interior of the rim was also described as coaxial and circular. The region between the exterior or the central post and the interior of the rim, then, is annular.

It should be stressed that, although the described embodiment is preferred, the membranes would still be annular if the central post and rim had the desired shape only in the region of the membranes with any other desired shape between the membranes.

It is also important to note that the boundaries of the membranes may be other than circular. The criterion is that the boundaries must be circularly symmetrical about the common translation axis, and the axis of circular symmetry of the boundaries of the two membranes must be the same. Note that the internal and external boundaries of the membranes may actually have different shapes. For example, the boundaries may be square or circular, and one may be square while the other is circular.

It is also important that the membranes be substantially parallel, but they may be misaligned slightly. For example, a misalignment of one arc minute would be tolerable.

Thus, the apparatus of this invention controllably moves and positions the corner mirror of a ring laser with only inward and outward translation. There is no tilting of the laser mirror by the fixture of this invention, but on the contrary the mirror is held untilted by the substantially parallel spaced-apart membranes 36, 42.

Although the invention has been described in detail above, it is not intended that the invention shall be limited by that description alone, but only by that description taken together with the accompanying drawings and claims.

What is claimed is:

1. In combination:
   a pair of substantially parallel spaced-apart flexible membranes, the radial boundaries of said membranes being circularly symmetrical about a common axis;

a first rigid rim member connecting the outer boundaries of said membranes;

a rigid central post member positioned for translation along said axis and connecting the inner boundaries of said membranes;

a rigid hub member axially positioned and adjacent and coaxial with a first end of said central post member, including bearing means attached to said hub member and bearing upon said first end of said central post member;

a metallic membrane attached at its inner boundary to said hub member and, in its undeflected condition extending radially from said hub member;

a second rim member including axially-directed flexible members on the edge thereof attached to said first rigid rim member and a rigid portion attached to the outer boundary of said metallic membrane;

a pair of piezoelectric wafers positioned and attached to opposite surfaces of said metallic membrane;

means for applying control voltage between said metallic membrane and the other surfaces of said piezoelectric wafers; and a mirror positioned on the second end of said central post member with its reflecting surface directed away from said flexible membranes and symmetrical with respect to said axis.

2. Apparatus as recited in claim 1 in which said rigid hub member, said metallic membrane, and said second rigid rim member are fabricated of temperature stable metal, and in which said piezoelectric wafers have substantially identical thermal expansion coefficients.

3. Apparatus as recited in claim 1 in which said inner and outer boundaries are concentric circles, and said inner boundaries have the same radius, and said outer boundaries have the same radius.

4. Apparatus as recited in claim 3 in which said rigid hub member, said metallic membrane, and said second rigid rim member are fabricated of temperature stable metal, and in which said piezoelectric wafers have substantially identical thermal expansion coefficients.

5. Apparatus as recited in claim 4 in which said mirror means is a curved mirror.

6. Apparatus as recited in claim 5 and further comprising:

a ring laser body having a gas conduit therein for supporting a ring laser path in which said curved mirror forms at least one of the corner mirrors of said ring laser;

an additional plurality of corner mirrors at the other corner of said laser path; and said first rigid member being sealed to said laser body.

7. In combination:

a pair of substantially parallel spaced-apart first and second flexible membranes, the boundaries of said membranes being symmetrical about a common axis;

a first rigid rim member connecting the outer boundaries of said membranes;

a rigid central post member positioned for translation along said axis and connected to said membranes;

a rigid hub member axially positioned and adjacent and coaxial with a first end of said central post member, including bearing means positioned to apply axial force to said first end of said central post member;

a third membrane attached at its inner boundary to said hub member and, in its undeflected condition, extending radially from said hub member;

a second rim member including axially-directed flexible members on the edge thereof attached to said first rigid rim member and a rigid portion attached to the outer boundary of said third membrane;

a pair of piezoelectric wafers positioned and attached to opposite surfaces of said third membrane;

means for applying control voltage to said piezoelectric wafers; and a mirror positioned on the second end of said central post member with its reflecting surface directed away from said flexible member.

8. The combination of claim 7 wherein the outer boundaries of said membranes are circular and concentric with said common axis.

9. The combination of claim 8 wherein said central post member is positioned upon the center of said first flexible membrane, and the inner boundary of said second flexible membrane is attached to the second end of said central post.

10. The combination of claim 9 wherein the outer boundaries of said first and second membranes have substantially the same radius.

11. The combination of claim 10 in which said bearing member bears against the center of said first flexible membrane.

12. The combination of claim 7 in which said third membrane is metallic, said piezoelectric wafers are mechanically and electrically attached to the surfaces of said third membrane, and said control voltage is applied between said third membrane and the other surfaces of said piezoelectric wafers.

13. Apparatus as recited in claims 7, 8, 9, 10, 11 or 12 in which said rigid hub member, said third membrane, and said second rigid rim member are fabricated of temperature stable metal, and in which said piezoelectric wafers have substantially identical thermal expansion coefficients.

14. Apparatus as recited in claims 7, 8, 9, 10, 11 or 12 in which said mirror is a curved mirror.

15. Apparatus as recited in claims 7, 8, 9, 10, 11 or 12 and further comprising:

a ring laser body having a gas conduit therein for supporting a ring laser path in which said mirror forms at least one of the corner mirrors of said ring laser;

an additional plurality of corner mirrors at the other corners of said laser path; and said first rigid member being sealed to said laser body.

* * * * *